(12) United States Patent
Gudesen et al.

(10) Patent No.: US 6,724,511 B2
(45) Date of Patent: Apr. 20, 2004

(54) MATRIX-ADDRESSABLE OPTOELECTRONIC APPARATUS AND ELECTRODE MEANS IN THE SAME

(75) Inventors: Hans Gude Gudesen, Brussels (BE);
Geirr I. Leistad, Sandvika (NO);
Per-Erik Nordal, Asker (NO)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/292,661

(22) Filed: Nov. 13, 2002

(65) Prior Publication Data

US 2003/0146371 A1 Aug. 7, 2003

Related U.S. Application Data

(60) Provisional application No. 60/333,478, filed on Nov. 28, 2001.

(30) Foreign Application Priority Data

Nov. 16, 2001 (NO) .............................................. 015622

(51) Int. Cl.⁷ ................................................. G02F 1/00
(52) U.S. Cl. ....................... 359/237; 313/500; 313/505; 313/507; 313/510; 345/76; 345/81; 345/87
(58) Field of Search ................................ 359/237, 238, 359/245, 248; 313/500, 501, 502, 503, 504, 505, 507, 510; 345/76, 77, 87, 92, 93, 94, 95, 96

(56) References Cited

U.S. PATENT DOCUMENTS

| | | | |
|---|---|---|---|
| 5,017,515 A | | 5/1991 | Gill |
| 5,504,323 A | | 4/1996 | Heeger et al. |
| 5,986,400 A | * | 11/1999 | Staring et al. ............... 313/503 |
| 6,303,943 B1 | | 10/2001 | Yu et al. |
| 6,590,335 B1 | * | 7/2003 | Nagayama ................... 313/506 |

* cited by examiner

Primary Examiner—Hung Xuan Dang
Assistant Examiner—Tuyen Tra
(74) Attorney, Agent, or Firm—Birch, Stewart, Kolasch & Birch, LLP

(57) ABSTRACT

In a matrix-addressable optoelectronic apparatus which includes a functional medium in the form of an optoelectronically active material provided in a global layer in sandwich between a first and second electrode with parallel strip-like electrodes wherein the electrodes of the second electrode are oriented at an angle to the electrodes of the first electrode, functional elements are formed in the active material where respective electrodes overlap and correspond to optically active pixels in a display device or pixels in an optical detector, depending upon the active material used. In each of the first and second electrode, the electrodes are provided in a dense parallel configuration and mutually insulated by a thin film with a thickness that is only a fraction of the width of the electrodes.

9 Claims, 5 Drawing Sheets

MATRIX-ADDRESSABLE OPTOELECTRONIC APPARATUS AND ELECTRODE MEANS IN THE SAME

This application claims the benefit of Provisional application Ser. No. 60/333,478 filed Nov. 28, 2001.

BACKGROUND OF THE INVENTION

1. Field of the Invention

The present invention concerns a matrix-addressable optoelectronic apparatus comprising a functional medium in the form of an optoelectronically active material provided in a global layer in sandwich between first and second electrode means, each with parallel strip-like electrodes wherein the electrodes of the second electrode means are oriented at an angle to the electrodes of the first electrode means, wherein functional elements are formed in volumes of the active material defined at respective overlaps between the electrodes of the first electrode means and the electrodes of the second electrode means to provide a matrix-addressable array with the electrodes in contact with the active material, wherein a functional element in the active material can be activated by applying a voltage to the crossing electrodes defining the element to form a light-emitting, light-absorbing, reflecting or polarizing pixel in a display device, or alternatively by incident light to form a pixel in an optical detector and outputting a voltage or current via the electrodes crossing at the pixel, said active material in either case being selected as an inorganic or organic material and capable according to the intended function either to emit, absorb, reflect or polarize light upon being a activated by an applied voltage or to output a voltage or current when stimulated by incident light, or both, whereby the addressing of a pixel in any case takes place in a matrix-addressing scheme, and wherein the electrodes of at least one of the electrode sets are made of a transparent or translucent material.

The present invention also concerns an electrodes means for use in the matrix-addressable optoelectronic apparatus, comprising a thin-film electrode layer with electrodes in the form of parallel strip-like electrical conductors, wherein the electrode layer is provided on an insulating surface of a backplane.

The present invention particularly concerns apparatuses and devices comprising functional elements in a planar array, wherein the functional elements are addressed via respectively a first electrode means with parallel strip-like electrodes arranged in contact with the functional elements on one side thereof and another electrode means with similar electrodes, but oriented perpendicular to the electrodes of the first means and provided in contact with the opposite side of the functional element. This constitutes what is called a matrix-addressable device. Such matrix-addressable devices can comprise e.g. functional elements in the form of logic cells, memory cells or in case of the present invention, pixels in a display or photodetector. The functional elements may include one or more active switching means, in which case the matrix-addressable device is termed an active matrix-addressable device, or the functional elements may consist of passive means only, e.g. resistive or capacitive means, in which case the matrix-addressable device is termed a passive matrix-addressable device.

The latter is regarded as providing a most efficient way of addressing, for instance in case of memory devices, as no switching elements, viz. transistors are required in memory cell. It is then desirable to achieve as high storage density as possible, but present design rules which set a lower limit to the cell are, also limit the fill factor thereof, i.e. the area of the active material of the matrix-addressable apparatus that actually can be used for the functional elements thereof.

2. State of the Art

A prior art passive matrix-addressable optoelectronic apparatus is shown in FIG. 1a and comprises an essentially planar global layer of optoelectronically active material 3 in sandwich between a first electrode means EM1 comprising parallel strip-like electrodes 1 of width w and spaced apart by a distance d and a similar second electrode means EM2 comprising parallel strip-like electrodes 2 of the same width w, but with the electrodes 2 arranged perpendicular to the electrodes 1 of the first electrode means EM1. In the global layer of active material 3 the overlap between the electrodes 1, 2 of the respective electrode means defines a pixel 5 in the active material 3. By applying voltage to the electrodes 1,2 crossing at this location, the pixel 5 will for instance emit light when the apparatus is configured as a display and by applying incident light to the pixel 5, a detectable current will be output on the electrodes 1,2 when the apparatus is configured as a photodetector.

FIG. 1b shows the prior art device of FIG. 1a in a section taken along the line X—X making the layout of the electrodes 1,2 and the global layer of the sandwiched active material 3 as well as the location of the pixels 5 apparent. The active material 3 of the global layer usually has properties such that an application of the voltage to crossing electrodes 1,2 only will affect the pixel 5 at the crossing thereof and not neighbouring pixels or cells at the electrodes crossings in the vicinity of the former. This can be achieved by providing the active material with anisotropic conducting property, such that electrical conduction only can take place in a perpendicular direction to the surface of the active material and between the overlapping electrodes, with no current flowing through the global layer to the other pixels. The size and density of pixels 5 will depend on a process-constrained minimum feature that can be obtained in the manufacturing process. Such features are, e.g. when electrodes are laid down as metallization which afterwards is patterned in a photomicrolithographic process resorting to photolithographic masks and e.g. etching, dependent on the process-constrained smallest feature f that can be defined by the mask and its value will in its turn depend on the wavelength of the light used. In other words, this feature f will usually within the scope of today's technology be limited to say 0.15–0.2 $\mu$m, and hence the width w of the electrodes 1,2 and the spacings therebetween will be of about this magnitude.

In that connection it should be noted that the value 2 f usually is termed the pitch and that the maximum number of lines per unit length as obtainable with prior art fabrication technology is given by the factor 1 f and correspondingly the maximum number of features per unit area by the factor 1 $f^2$. Hence if the area 4 shown in FIG. 1 is considered, it will be evident that the size of a pixel 5 is given by $f^2$ as apparent from FIG. 1c which shows the area 4 in greater detail. Each pixel 5 requires a real estate corresponding to the area 4, the size of which is 4 $f^2$, in other words, four times larger than the area $f^2$ of the pixel. This consideration shows that the matrix in FIG. 1a has a fill factor of 0.25, i.e. $f^2/4\ f^2$. The degree of exploitation of the area offered by the layer 3 is thus low. In order to arrive at a higher fill factor or a higher density of pixels 5 in the global layer it would be desirable to increase either the fill factor or to obtain a higher resolution in the process-constrained features of the matrix, e.g. into the sub-0.1 $\mu$m range. However, although this may increase the total number of pixels in a similar area, still it would not be able to guarantee a higher fill factor.

SUMMARY OF THE INVENTION

In view of the above considerations it is a major object of the present invention to enable an increase of the fill factor in a matrix-addressable optoelectronic apparatus of the afore-mentioned kind to a value approaching unity and to achieve a maximum exploitation of the real estate offered by the global layer of the active material 3 in such apparatuses without actually being constrained by the actual or practical size of the process-constrained minimum feature f, as the fill factor will not be influenced by decrease in f, although such a decrease of course, will serve to further increase the maximum number of pixels obtainable in a global layer of the active material 3.

The above objects as well as further advantages and features are achieved according to the present invention with a matrix-addressable optoelectronic apparatus which is characterized in that the electrodes of each electrode means are provided in a respective electrode layer, that the electrodes in the electrode means all have about the same width w, that electrodes of each electrode means are mutually insulated electrically by an insulating thin film of thickness $\delta$, the magnitude of $\delta$ being a fraction of the width w, and that minimum magnitude of w is comparable to a process-constrained minimum feature size f, whereby the fill factor of the pixels in the optoelectronically active material relative thereto is close to 1 and the number of pixels approaches a maximum defined by the total area A of the active material sandwiched between the electrode means, and said feature size f, said maximum thus being defined by $A/f^2$.

In an advantageous embodiment of the apparatus according to the invention, the optoelectronically active material is an anisotropic conducting organic material with diode domains contacting the electrodes of the electrode means, and then the organic conducting material can preferably be a conjugated light-emitting and/or photoelectric polymer, whereby the matrix-addressable apparatus can be operated as a display or as a photodetector or both.

In this advantageous embodiment of the apparatus according to the invention, the diode domains can be capable of emitting light when stimulated by an applied voltage, whereby the matrix-addressable apparatus can be operated as a display, or the diode domains can be capable of outputting a current or voltage when stimulated by incident light, whereby the matrix-addressable apparatus can be operated as s photodetector.

The above objects as well as further advantages and features are also achieved according to the present invention with an electrode means which is characterized in that the thin-film electrode layer comprises
a first set of said strip-like electrodes of width $w_a$ and thickness $h_a$ provided on the backplane, the electrodes of the first set being mutually spaced apart by distance d equal to or greater than $w_a$, a second set of said strip-like electrodes with width $w_b$ and thickness $h_b$ provided in the spacings between the electrodes of the first set and electrically insulated therefrom by a thin film of an electrically insulating material with thickness $\delta$ and at least extending along the side edges of the parallel electrodes and forming an insulating wall of thickness $\delta$ therebetween, the magnitude of $\delta$ being small compared to the magnitude of either $w_a$ or $w_b$, with the spacing distance d between the electrodes of the first set being $w_b+2\delta$, and that the electrode layer with electrodes and the insulating thin film forms a global planar layer in the electrode means on the backplane thereof.

In an advantageous embodiment of the electrode means according to the present invention the insulating walls between the electrodes of the first set and the electrodes of the second set form portions of the thin film of insulating material provided in a layer covering the side edges of the electrodes of the first set up to the top surface thereof as well as the backplane in the spacings between the former, and that the electrodes of the second set are provided in recesses between the wall portions of the insulating thin film and above a portion thereof covering the backplane, the electrodes of the second set being flush with the top edge of the insulating walls as well as the top surface of the electrodes of the first set, whereby the electrodes of the second set have the height $h_b=h_a-\delta$, and that the electrode layer with electrodes and insulating material form a global planar layer of thickness $h_a$ in the electrode means on the backplane thereof.

In at least one of the electrode means according to the invention the electrodes as well as the backplane must be made of a transparent or a translucent material, when the electrode means are used in the inventive apparatus. The invention shall now be explained in more detail with reference to exemplary embodiments in conjunction with the appended drawing figures,

DETAILED DESCRIPTION OF THE INVENTION

Figure 1A:
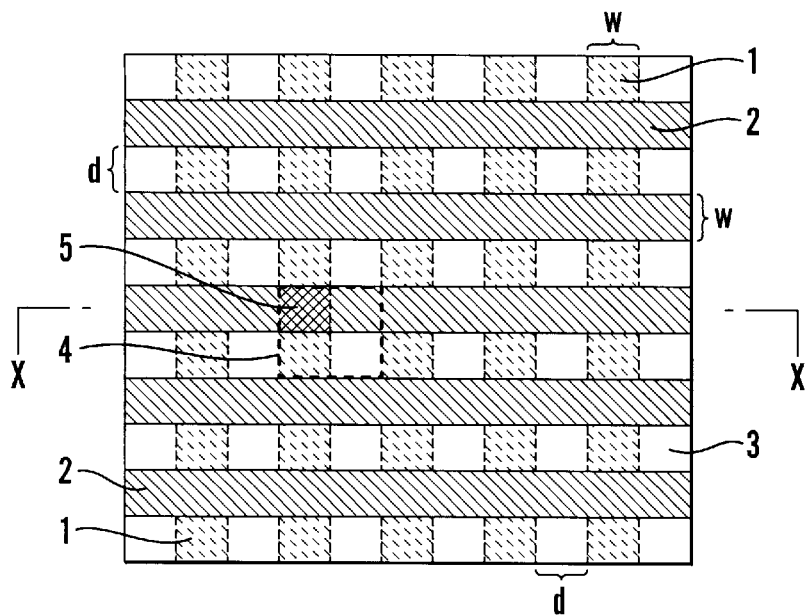
FIGS. 1a–c show a prior art matrix-addressable optoelectronic apparatus exemplifying a conventionally attainable fill factor in such apparatuses, FIG. 2a a plan view of a matrix-addressable optoelectronic apparatus according to the invention, FIG. 2b a section taken along line X—X in FIG. 2a, FIG. 2c a detail of FIG. 2a and illustrating the fill factor attainable with the present invention, FIG. 3 a section through a first embodiment of the electrode means according to the present invention, FIG. 4 a section through a second embodiment of the electrode means according to the invention, FIG. 5 schematically a cross section through light-emitting pixel as used in the apparatus according to the invention, FIG. 6 schematically a cross section through a light-detecting pixel as used in the apparatus according the invention, and FIG. 7 schematically the structure of a preferred optoelectronically active material as used in the pixel in either FIG. 5 and FIG. 6.
Figure 1B:
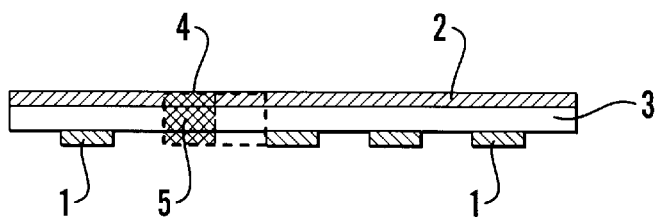
Figure 1C:
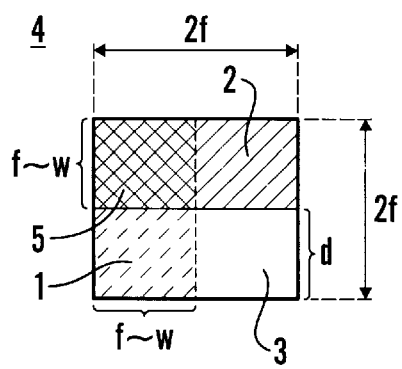
Figure 2A:
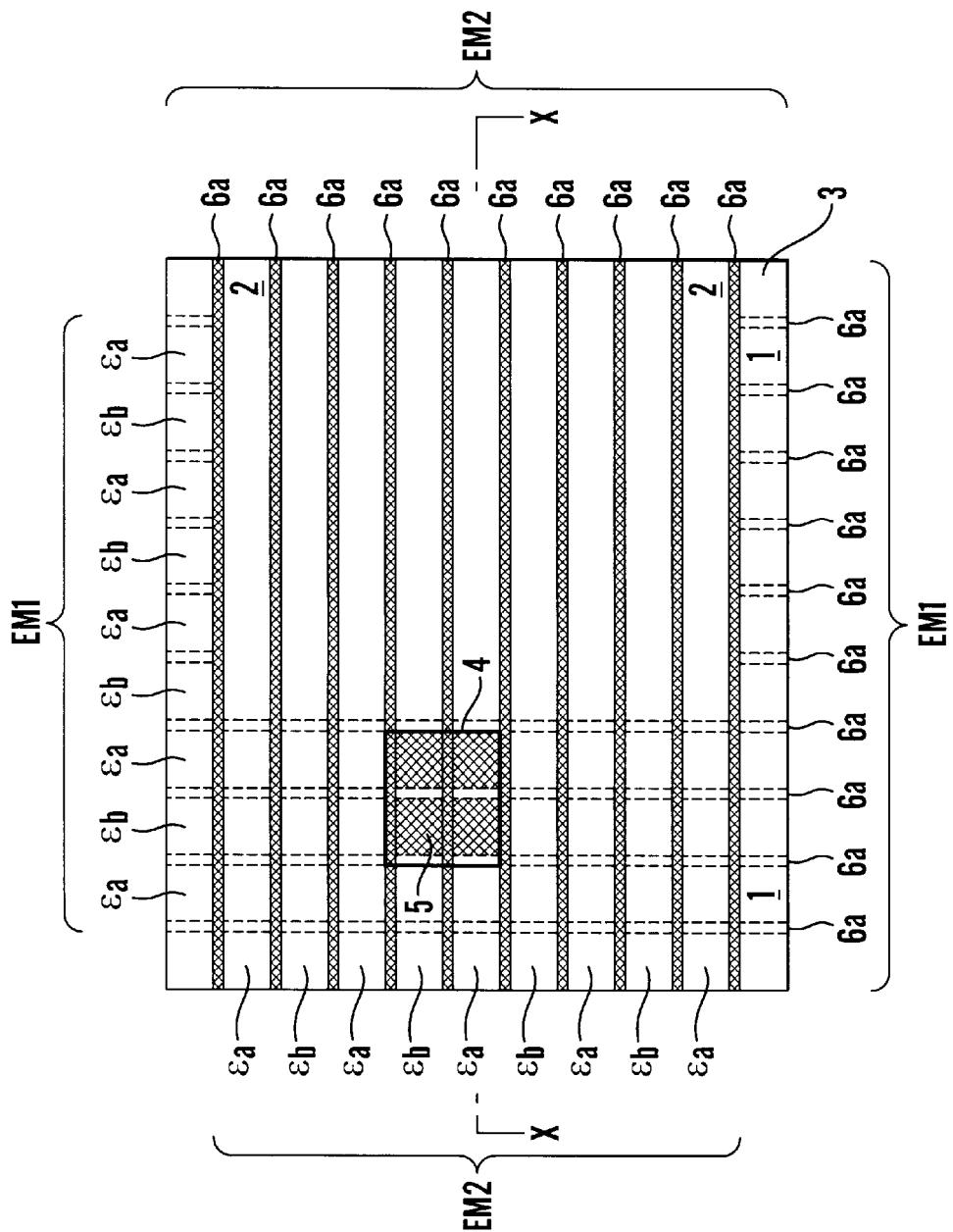
Figure 2B:
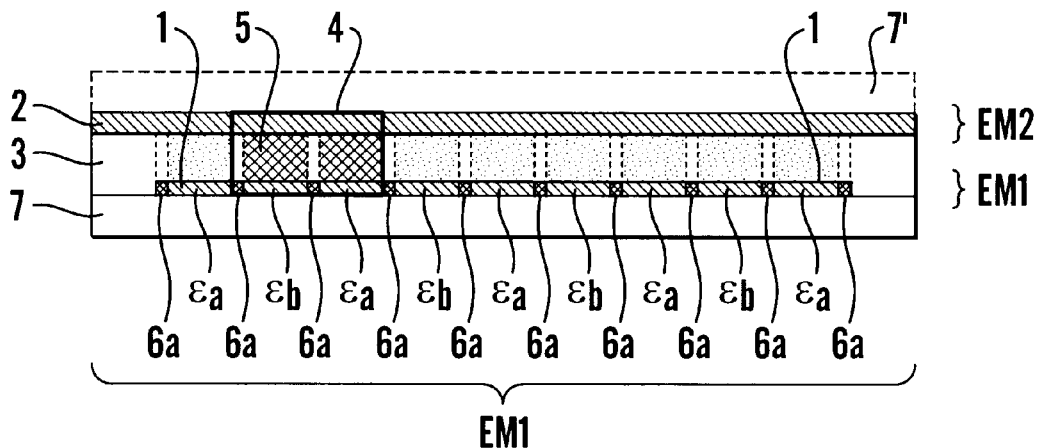
Figure 2C:
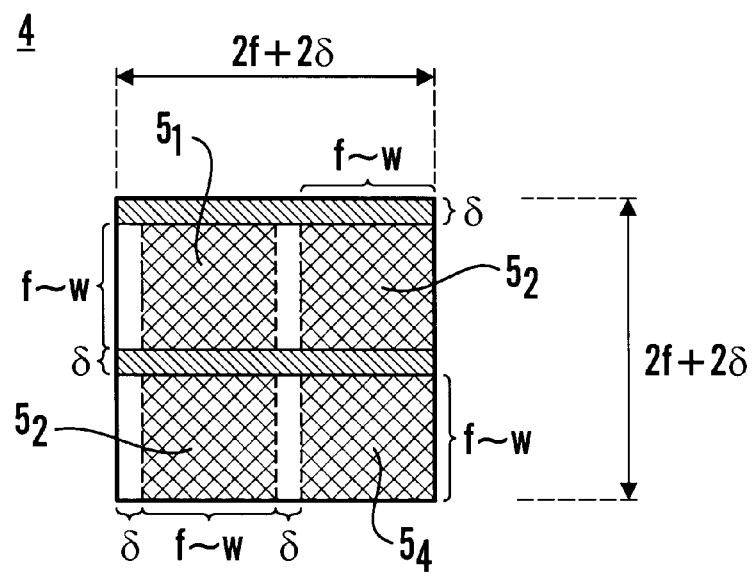

With reference to FIGS. 2a, 2b and 2c a discussion shall now be given of an apparatus according to the invention and including the electrode means of the invention. From this discussion it shall then also become apparent how the electrode means according to the invention shall allow the fill factor to approach unity in an apparatus of this kind. A structurally similar apparatus, but configured as a matrix-addressable ferroelectric memory device, is the subject of a co-pending Norwegian patent application No. 20015509 belonging to the same applicant as the present application, and now also filed as a PCT application with publication NO. WO 03/043013.

The apparatus according to the invention is shown in plan view in FIG. 2a in an embodiment which is restricted to a passive matrix-addressable configuration wherein an optoelectronically active material 3 is deposited in a global layer and sandwiched between two of the electrode means EM1, EM2 according to the invention. The first electrode means EM1 which could be any of the embodiments shown in FIG. 3 or 4, will be identical to the electrode means EM2 which, however, is provided with the parallel strip-like electrodes 2 oriented at an angle and preferably perpendicular to the corresponding electrodes 1 in the electrode means EM1, as shown. Where the electrodes 1,2 overlap, a pixel 5 is defined in the optoelectronically active material 3 therebetween. The pixel 5 can be a semiconducting inorganic or organic material capable of emitting light or generating a photocurrent upon an appropriate stimulation, e.g. by an applied voltage in the former case or by incident light in latter case. Most preferably the optoelectronically active material shall be a conjugated polymer with an anisotropic electrical conductivity, such that conduction only shall take place between overlapping electrodes 1,2 and perpendicular to the plane of the active material layer. The driving, sensing and control circuitry are for clarity's sake not shown in FIG. 2a, but could in practical embodiments be implemented in CMOS technology based on silicon and provided in the backplane 7 if this is made in the same material. All electrodes 1,2 would then be suitably routed and connected to said circuitry, in a manner well understood by persons skilled in the art.

As mentioned, the active material 3 is sandwiched between the electrode means EM1, EM2, as seen to advantage in FIG. 2b which shows a section through the apparatus in FIG. 2a taken along the line X—X. At the overlap or crossings of the electrodes 1,2 a pixel 5 is defined in the active material 3, i.e. the light-emitting or photoconductive material. As the electrodes 1,2 in the respective electrode means EM1, EM2 in any case are only separated by a very thin film 6a of insulating material, the thickness $\delta$ of which being only a tiny fraction of that of the width w of the electrodes 1,2 and corresponding most preferably to a process-constrained or process-definable minimum feature f, it will be seen that the electrode means EM according to the present invention allows an increase in the fill factor towards unity.—It should be noted that alternating electrodes in the electrode means EM the electrodes $\epsilon_a, \epsilon_b$ in any case may have different widths $w_a, w_b$, but as $w_a \sim w_b$, their widths in practice can be considered having about the same value w.

This will be seen to advantage when one considers a planar section 4 comprising four pixels $5_1$–$5_4$ as shown in FIG. 2c. The area occupied by the insulating walls 6a between the electrodes are defining the area of the pixels $5_1 \ldots 5_4$ and the electrodes themselves in either electrode means EM1, EM2 will be 4 $f^2+8$ $f\delta+4\delta^2$. This implies that with $\delta$ being only a tiny fraction of either f or the width w of the electrodes 1,2, the fill factor approaches unity in the apparatus according to the invention, meaning that close to 100% of the area of the active material 3 sandwiched between the electrode means EM1, E2 is taken up by the pixels 5, the average size of which will be $f^2$. For instance, if f~w is set to unity and $\delta=0.01$ f, the area of the planar section will be 4+8×0.01+0.0004~4.08 and the fill factor becomes 4/4.08=0.98, i.e. a fill factor of 98%. The maximum number of pixels 5 in the matrix, given that the area of the accessible active material 3 is A, will then be close to A/$f^2$ in the apparatus according to the present invention. For instance, if the design rule applied sets f as 0.2 $\mu$m, and an active material 3 area A is $10^6$ $\mu$m, $0.98 \cdot 10^6/0.2^2 = 24.5 \cdot 10^6$ addressable pixels 5 could be provided implying a pixel density of about $25 \times 10^6/mm^2$. Wherein the electrodes as known in the prior art are separated by a distance d defined by the minimum process-constrained feature f, the planar section 4 shown in FIG. 2c shall only contain one pixel 5 and the fill factor accordingly be 0.25 or 25%, while the maximum number of pixels attainable then of course, will be ¼ of the number that can be achieved with the apparatus according to the present invention.

When the apparatus according to the invention as shown in FIGS. 2a–c is configured as a as a display device, the active material 3 would then be capable of light emission when stimulated by a voltage applied to the respective crossing electrodes 1,2 of the electrode means EM1, EM2 and the pixel 5 defined at the overlap between respective electrodes 1,2 would now of course, be a pixel in the display. As the fill factor of course in any case will approach unity, it will be possible to obtain a high resolution display wherein the almost whole area A of the display is devoted to the pixels. Moreover, an increase in the fill factor from say 0.25 towards 1 shall allow a display with a correspondingly increased surface brightness. As the pixels at least on one side of the display must be exposed to the exterior, this implies that at least the electrodes 1;2 in one of the electrode means EM1;EM2 must be transparent or translucent and likewise the same shall apply to the material of one of the backplanes 7. In FIG. 2b the backplane 7 could be realized with circuitry for driving, sensing and control as mentioned, while an opposite backplane 7' indicated by a stitched outline as well as the electrodes 2 must be transparent or translucent to optical radiation. Also the insulating material used in the insulating thin film 6 could of course in such cases be transparent or translucent, and the electrodes 2 could e.g. as well-known by persons skilled in the art be made of indium tin oxide (ITO) as commonly used in light-emitting devices.

Figure 3:
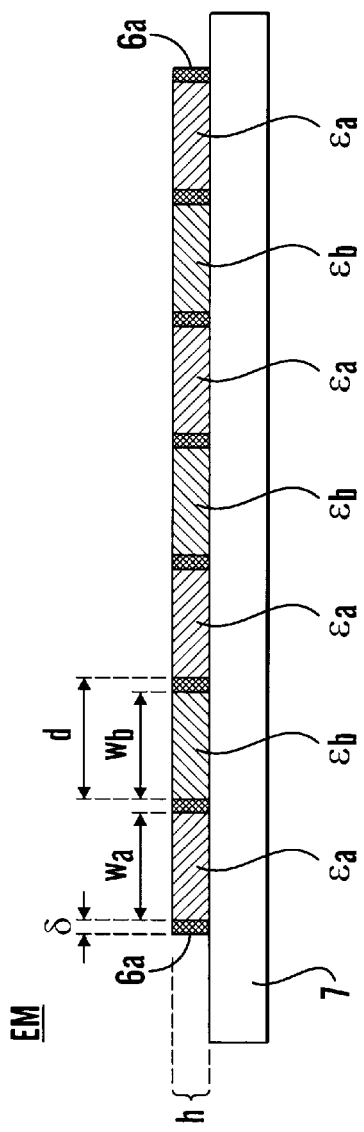

A first preferred embodiment of the electrode means EM is shown in FIG. 3. Herein the electrode means EM comprises the plurality of strip-like electrodes $\epsilon_a, \epsilon_b$ provided on a backplane 7. The electrodes $\epsilon_a$ can be envisaged as belonging to a first set of electrode and formed from an applied global layer of electrode material which subsequently are patterned in a photolithographic step using a suitable mask, while the electrodes $\epsilon_b$ between the former can be regarded as belonging to a second set of electrodes which are deposited after the application of the insulating wall portion 6a and in the recesses between the electrodes $\epsilon_a$ as generated in the patterning steps thereof. The distance between two electrodes $\epsilon_a$ is d, the width of the electrodes $\epsilon_a$ is $w_a$, the width of the electrodes $\epsilon_b$ is $w_b$. Now the values $w_a, w_b$ and the distance d have about a similar magnitude, the minimum of which will be given by the process-constrained minimum feature f obtainable in the patterning process for generating the electrodes $\epsilon_a$. At the same time the thickness $\delta$ of the insulating wall portions 6a between the electrodes $\epsilon_a, \epsilon_b$ is not constrained by f and may have a thickness down to a nanometer scale, with the only constraint to provide an insulating thin film for preventing electrical faults and breakdown between the electrodes $\epsilon_a, \epsilon_b$. In other words, provided that the surface of the backplane 7 interfacing the electrodes as required also is electrically insulating, all the parallel strip-like electrodes $\epsilon_a, \epsilon_b$ will be mutually electrically insulated. It should be noted that a height of both $\epsilon_a, \epsilon_b$ as well as the insulating wall portion 6a is h and one has the equation $d = w_b + 2\delta$. Provided that the distance d between the electrodes is selected as $w_a + 2$ d, the width $w_a; w_b$ of the electrodes $\epsilon_a; \epsilon_b$ will be the same and equal to the value w, all electrodes $\epsilon_a, \epsilon_b$ thus having the same cross-section area and if made of the same conducting material $\epsilon$, also the same conducting properties.

Figure 4:
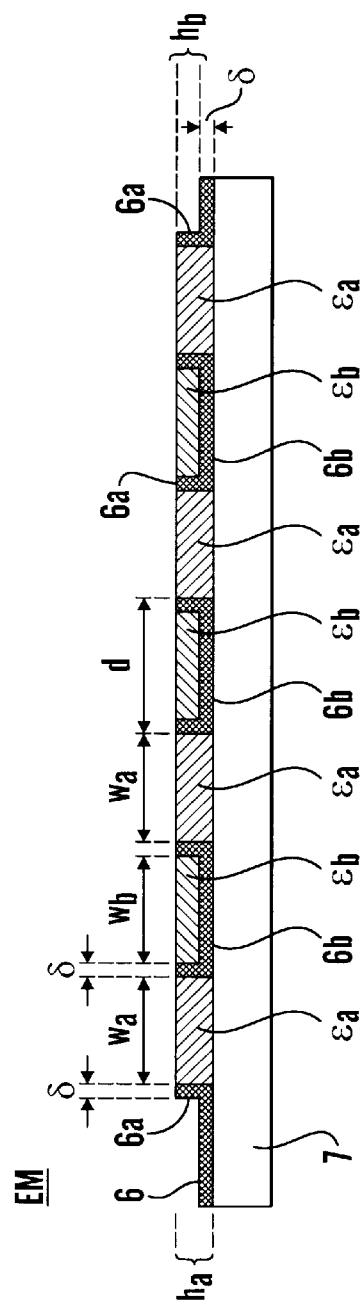

In the embodiment of the electrode means EM according to the invention shown in FIG. 4 the electrodes $\epsilon_a$ as are before formed in a patterning step from a globally applied layer of electrode material and then the insulating thin film 6 is deposited globally covering the substrate 7 and the electrodes $\epsilon_a$. A conducting material is now deposited filling and covering the insulating layer 6b in the recesses between the electrodes $\epsilon_a$ and then in a subsequent planarization step the portion of the insulating thin film 6 covering the electrodes $\epsilon_a$ as well as excess electrode material resulting from the deposition of electrodes $\epsilon_b$ are removed, leaving the electrodes $\epsilon_a, \epsilon_b$ exposed in the surface of the electrode layer and flush with the top edge of the wall portion 6a of the insulating thin film 6. All electrodes $\epsilon_a, \epsilon_b$ have then exposed top surfaces and can form an ohmic contact with any applied optoelectronically active material 3 thereabove, but as is the case a capacitive coupling may be had if the active material is dielectric, for instance a liquid crystal material, and in that particular circumstance, even the top surfaces of the electrodes 1,2 could be covered by the insulating thin film 6. This will of course apply to the above embodiment. The considerations regarding the minimum width $w_a$, $w_b$ of the electrodes $\epsilon_a, \epsilon_b$ are also valid here. Moreover it will be seen that the height $h_a$ of an electrode $\epsilon_a$ differs from the height $h_b$ of an electrode $\epsilon_b$ by the amount $\delta$ corresponding to the thickness $\delta$ of the portion 6b of the thin film 6 covering the substrate 7. This as before implies that the distance d between the electrodes $\epsilon_a$ must be increased in the patterning process in order to obtain electrodes $\epsilon_a, \epsilon_b$ with equal cross section if that is desirable, e.g. for obtaining the same conducting capacity if the electrodes $\epsilon_a, \epsilon_b$ are made of conducting material with the same conductivity.

The planarization of the electrode layer of the electrode means EM according to the invention can in both the embodiments as shown in FIGS. 3,4 can take place by any suitable means, e.g. chemomechanical polishing, controlled etching or a controlled micro-abrasive process. For detail concerning the fabrication of the embodiments of the electrode means according to the invention as depicted in FIGS. 3,4, and methods for their manufacture reference may be made to the above-mentioned published PCT application WO 03/043013.

Concerning the electrode materials for the electrode means EM as used in the apparatus according to the invention, they could as mentioned be any suitable conducting material, e.g. metals like titanium or aluminium, which commonly are used in electronic devices. The electrode materials may also be organic materials, for instance conducting polymers, but must then be compatible with the process used for forming the insulating thin-film layer or any process used for removing portions thereof. Further it is evident that the electrodes of at least one of the electrode means EM must be transparent or translucent to optical radiation, as mentioned, to enable the function of the apparatus as a display or photodetector.

While it should be understood that the width w of the electrodes of the electrode means EM according to the invention shall have a minimum value defined by the process-constrained minimum feature f, it will of course in the first instance only be the width of the electrodes $\epsilon_a$ of the first set which must be formed by patterning, as well as the distance therebetween that is so restricted. The electrodes $\epsilon_b$ can be deposited by processes which are not restricted by a design rule applying to the patterning process. The same of course applies to the application of the insulating thin film which can take place e.g. by oxidation, vapour deposition or spraying or sputtering down to almost monoatomic dimensions. The only requirement is that it should provide the necessary electrical insulation between the adjacent electrodes $\epsilon_a$ and $\epsilon_a$ in the respective set s of electrodes in the electrode means EM. Also while f in conventional photomicrolithographic processes usually would be in the range of 0.2 $\mu$m or somewhat less, other technologies presently established or under development would allow features in the nanoscale range, i.e. electrode widths down to a few tens of nanometers and for instance the use of chemomechanical processing in the nanoscale range to achieve the necessary planarization, which in any case would yield electrode means EM with a top surface of high planarity and wherein all component parts, i.e. electrodes $\epsilon_a, \epsilon_b$ as well as the insulating thin film 6 will be flush in the top surface.

Generally the use of the electrode means EM in the apparatus according to the invention with the active medium sandwiched by two of the inventive electrode means and the parallel strip-like electrodes and oriented mutually at an angle and preferably perpendicularly so as to form a matrix-addressable display or a photodetector, shall allow a fill factor approaching unity and a maximum number of definable pixels only constrained by the applicable design rule for the patterning process of the electrodes.

Figure 5:
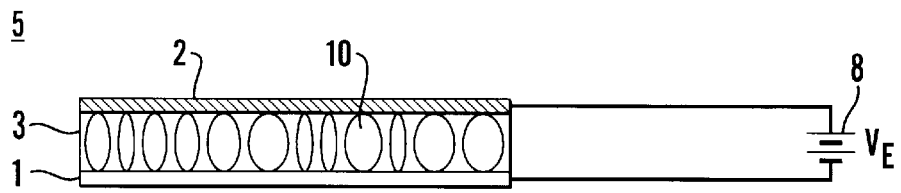

FIG. 5 shows schematically the structure of a single pixel in an embodiment where the apparatus according to the invention is a display. Between an electrode 1 of the first electrode means EM1 and an electrode 2 of the second electrode means EM2 there is provided an optoelectronically active material 3 comprising light-emitting domains 10, preferably in the form of light-emitting polymer diodes. The light-emitting polymer diodes 10 is supplied with working voltage $V_E$ via the electrodes 1, 2 which are connected to a power supply 8. It is to be understood that the electrodes 1, 2 of course are part of the strip-like electrodes 1;2 of each of the electrode means EM1;EM2 such that electrode 2 in any case will be oriented preferably perpendicular to electrode 1. The light-emitting diodes 10 could be wavelength-tuneable and in that case the active material 3 would contain light-emitting diodes wherein the wavelength is tuned by varying the voltage $V_E$ as e.g. described in the International published patent application WO95/031515.

It should be noted that the apparatus according to the invention also could be a non-emitting display, i.e. a display where the pixels in response to an applied voltage may reflect, absorb or polarize light. This will be the case when the optoelectronically active material is a liquid crystal material and such displays are, of course, well-known in the art, but will by using the electrode means according to the present invention gain the same advantages as embodiments with light-emitting pixels. As the liquid crystal material is dielectric, it should be noted that contacting top surfaces of the electrodes of the electrode means then actually could be covered by insulating thin film 6, as already mentioned. In this regard reference may be made to the already cited published PCT application WO 03/043013, wherein relevant alternative embodiment of the electrode means are disclosed.

Figure 6:
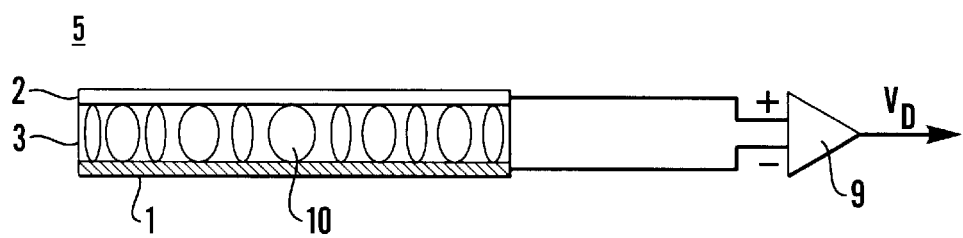

FIG. 6 shows schematically a pixel 5 in an embodiment where the apparatus according to the invention is an optical detector. The optoelectronically active material 3 is similar to the light-emitting material in the embodiment in FIG. 5 and provided the sandwich between electrodes 1, 2 and oriented in similar manner. The electrodes 1, 2 will when the active material 3 is stimulated by incident light to generate a current or voltage, convey a signal voltage $V_D$ to a sense amplifier 9.

It is of course, evident that at least one of the electrodes 1,2 in FIG. 5 or FIG. 6 must be transparent and the same applies to the backplane (not shown) 7 on which the electrode in case are provided. Concerning the optoelectronically active material 3 this may as mentioned be either light-emitting diodes or photoelectric diodes and particularly preferred are organic diodes of this kind based on conjugated polymers which as already mentioned have been described in International published patent application WO95/031515. It should be noted that such light-emitting polymer diodes can be wavelength-tuneable and emit light on several wavelengths by varying the working voltage of the diode. In case such diodes also have photoelectric properties and thus will be suited for application in a detector pixel as shown in FIG. 6, it should be noted that their peak sensitivity wavelength will be different from their peak emission wavelength and shifted towards shorter wavelengths than those of the optical emission. This is the phenomenon termed Stokes shift, as well-known to persons skilled in the art. The diodes of the optoelectronically active material may be manufactured as a polymer thin film with domains of conjugated polymers and with a thickness of a few tens of nanometers and even less. The size of the individual diodes shall not be much larger.

Figure 7:
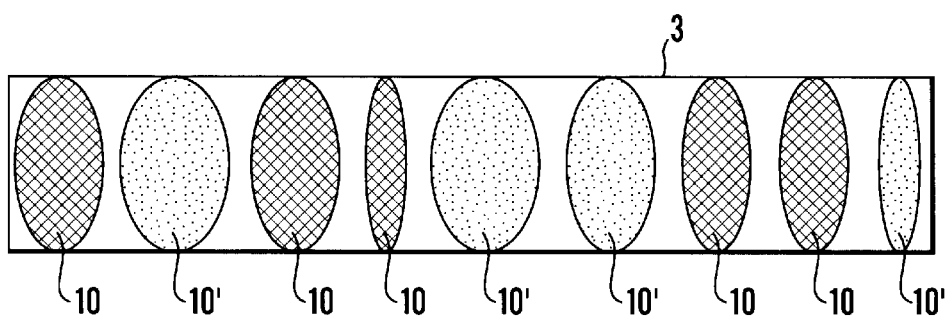

A pixel may contain a number of physically separated light-emitting or light-absorbing domains 10, 10', as illustrated in FIG. 7 which may be regarded as a schematic cross section through a single pixel 5 in the apparatus according to the invention. Of course the layer 3 of active material forms part of a global layer therein with the domains 10, 10' each being only one type of light-emitting polymer or light-absorbing polymer, with different emitting or absorbing wavelength bands. Moreover, the conjugated polymer thin film can be anisotropic electrical conducting and hence a current applied to the layer of active material sandwiched between the electrodes 1,2 will only flow between the electrodes defining each separate pixel 5 and not in the transversal direction. To obtain the full effect of the light emission or a photovoltaic effect, all the domains 10,10', whether being light-emitting or light-absorbing, should contact the electrodes 1,2, and it will be seen that in the inventive apparatus with electrode means EM according to the invention and with the fill factor approaching unity this will actually be the case, such that in the apparatus according to the invention either can provide a display with maximum surface brightness or a photodetector with maximum sensitivity, as is the case. Moreover, it is also evident that the ensuing high fill factor due to the thickness δ of the insulating material 6 being only a tiny fraction of the electrode width will allow a very high pixel density and an effective pixel area approaching the total area A of the global layer of active material 3. Also the resolution or the degree of pixellation, i.e. the number of pixels obtainable in the apparatus, will attain the maximum allowed by the magnitude of the process-constrained minimum feature f. In sum any of the considerations above serve to emphasize the radical increase in performance that will be obtainable with the apparatus according to the present invention, whether it is configured as a display or as an optical detector.

When configured as a display it can be both a monochrome or a colour display. In the latter case, the active material could comprise diode domains 10, 10' emitting on different wavelengths, depending on the working voltage $V_E$ applied. For instance an increase in $V_E$ would shift the dominant emission toward shorter wavelengths, provided that diode domains 10,10' having their peak emission in e.g. the red and blue range of the optical radiation spectrum, respectively. In other words, wavelength tuning of a single pixel is in this case obtained by changing the voltage $V_E$ applied thereto via the electrodes 1,2 contacting the pixel.

Also as mentioned the active material could be a liquid crystal material, in which case the pixels, of course, would upon stimulation either could be reflecting, light-absorbing or polarizing, as well-known to persons skilled in the art.

When configured as an optical detector, the apparatus could be used to advantage as the detector of an optoelectronic camera, and mutatis mutandis enable a colour camera, with diode domains 10,10' having different wavelength sensitivity and generating a current response or voltage $V_D$ with components dependent of the wavelength of the incident light. The high resolution, i.e. the high degree of pixellation of the inventive apparatus, would then be comparable to that of a conventional photographic film which in a 24×36 mm format may have more than $3 \times 10^7$ pixels depending on the properties of the emulsion, thus attaining a linear resolution in the order of 5 μm. Scaling an optical detector according to the invention with regard to its degree of pixellation a 1.2×1.2 mm detector chip designed with f=0.20 μm would yield the same performance as the 24×36 mm film format. However, when the apparatus according to the present invention is used as an optical detector in an electronic camera, one should keep in mind that the effective pixel size must be compatible with the wavelength λ of the incident length, i.e. at least ½λ, in other words for the range from ultraviolet to near infrared, about 0.1μ to 1.0μ. This of course, implies that the effective area of the active material and the size of the detector must be correspondingly adjusted to obtain a resolution comparable with that of available photographic emulsions.

What is claimed is:

1. A matrix-addressable optoelectronic apparatus comprising a functional medium in the form of an optoelectronically active material provided in a global layer in sandwich between first and second electrode means, each with parallel strip-like electrodes, wherein the electrodes of the second electrode means are oriented at an angle to the electrodes of the first electrode means, wherein functional elements are formed in volumes of the active material defined at respective overlaps between the electrodes of the first electrode means and the electrodes of the second electrode means to provide a matrix-addressable array with the electrodes in contact with the active material, wherein a functional element in the active material can be activated by applying a voltage to the crossing electrodes defining the element to form a light-emitting, light-absorbing, reflecting or polarizing pixel in a display device, or alternatively by incident light to form a pixel in an optical detector and outputting a voltage via the electrodes crossing at the pixel, said active material in either case being selected as an inorganic or organic material and capable according to the intended function either to emit, absorb, reflect or polarize light upon being activated by an applied voltage or to output a voltage or current when stimulated by incident light, or both, whereby the addressing of a pixel takes place in a matrix-addressing array, and wherein the electrodes of at least one of the electrode sets are made of a transparent or translucent material, wherein the electrodes of each first and second electrode means are provided in a respective electrode layer, so that the electrodes in the first and second electrode means all have about the same width w, the electrodes of each electrode means are mutually insulated electrically by an insulating thin film of thickness δ, the magnitude of δ being a fraction of the width w, and so that a minimum magnitude of w is comparable to a process-constrained minimum feature size f, whereby the fill factor of the pixels in the optoelectronically active material relative thereto is close to 1 and the number of pixels approaches a maximum defined by the total area A of the active material sandwiched between the electrode means, and said feature size f, said maximum thus being defined by $A/f^2$.

2. A matrix-addressable optoelectronic apparatus according to claim 1, wherein the optoelectronically active material is an anisotropic conducting organic material with diode domains contacting the electrodes of the first and second electrode means.

3. A matrix-addressable optoelectronic apparatus according to claim 2, wherein the organic conducting material is a conjugated light-emitting and/or photoelectric polymer, whereby the matrix-addressable apparatus can be operated as a display or as a photodetector or both.

4. A matrix-addressable optoelectronic apparatus according to claim 2, wherein the diode domains are capable of emitting light when stimulated by an applied voltage, whereby the matrix-addressable apparatus can be operated as a display.

5. A matrix-addressable optoelectronic apparatus according to claim 2, wherein the diode domains are capable of outputting a current or voltage when stimulated by incident light, whereby the matrix-addressable apparatus can be operated as photodetector.

6. A matrix-addressable optoelectronic apparatus according to claim 1, wherein the optoelectronically active material is a liquid crystal material, whereby the matrix-addressable apparatus can be operated as display with reflecting, absorbing or polarizing pixels.

7. An electrode means, for use in a matrix-addressable optoelectronic apparatus, comprising: a thin-film electrode layer with electrodes in the form of parallel strip-like electrical conductors, wherein the electrode layer is provided on an insulating surface of a backplane, wherein the thin-film electrode layer includes a first set of said strip-like electrodes of width $w_a$ and thickness $h_a$ provided on the backplane, the electrodes of the first set being mutually spaced apart by distance d equal to or greater than $w_a$, a second set of said strip-like electrodes with width $w_b$ and thickness $h_b$ provided in the spacings between the electrodes of the first set and electrically insulated therefrom by a thin film of an electrically insulating material with thickness δ and at least extending along the side edges of the parallel electrodes of the first and second sets and forming an insulating wall of thickness δ therebetween, the magnitude of δ being small compared to the magnitude of either $w_a$ or $w_b$, with the spacing distance d between the electrodes of the first set being $w_b+2δ$, wherein the electrode layer with electrodes of the first and second sets and the insulating thin film forms a global planar layer in the electrode means on the backplane thereof.

8. An electrode means according to claim 7, wherein the insulating walls between the electrodes of the first set and the electrodes of the second set form portions of the thin film of insulating material provided in a layer covering the side edges of the electrodes of the first set up to the top surface thereof as well as the backplane in the spacings between the former, and that the electrodes of the second set are provided in recesses between the wall portions (6a) of the insulating thin film and above a portion thereof covering the backplane, the electrodes of the second set being flush with the top edge of the insulating walls as well as the top surface of the electrodes of the first set, whereby the electrodes of the second set have the height $h_b=h_a-δ$, and that the electrode layer with electrodes and insulating material form a global planar layer of thickness $h_a$ in the electrode means on the backplane thereof.

9. An electrode means according to claim 7, wherein the electrodes of the first and second sets as well as the backplane are made of a transparent or translucent material.

* * * * *